(12) United States Patent
Anderson

(10) Patent No.: US 6,408,215 B1
(45) Date of Patent: Jun. 18, 2002

(54) ISOTHERMAL PORT FOR MICROWAVE NETWORK ANALYZER AND METHOD

(75) Inventor: Wendell Anderson, Santa Rosa, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/064,810

(22) Filed: Apr. 22, 1998

(51) Int. Cl.$^7$ ................................................ G05B 13/02
(52) U.S. Cl. .......................... 700/28; 700/240; 700/51; 700/299; 700/300; 700/276
(58) Field of Search ............................ 700/28, 240, 51, 700/79, 37, 71, 299, 300, 276; 714/38

(56) References Cited

U.S. PATENT DOCUMENTS

| | | | | |
|---|---|---|---|---|
| 4,518,700 A | * | 5/1985 | Stephens | 436/52 |
| 4,534,941 A | * | 8/1985 | Stephens et al. | 422/70 |
| 4,704,872 A | * | 11/1987 | Jones | 62/3.2 |
| 4,959,614 A | * | 9/1990 | Bowling et al. | 324/636 |
| 5,028,988 A | * | 7/1991 | Porter et al. | 257/716 |
| 5,097,829 A | * | 3/1992 | Quisenberry | 607/105 |
| 5,268,636 A | * | 12/1993 | Phillips et al. | 324/158.1 |
| 5,419,780 A | * | 5/1995 | Suski | 136/205 |
| 5,505,046 A | * | 4/1996 | Nelson et al. | 62/3.6 |
| 5,563,505 A | * | 10/1996 | Dorothy et al. | 324/71.6 |
| 5,569,950 A | * | 10/1996 | Lewis et al. | 257/467 |
| 5,648,038 A | * | 7/1997 | Fathi et al. | 264/406 |
| 5,712,448 A | * | 1/1998 | Vandersande et al. | 136/203 |
| 5,754,766 A | * | 5/1998 | Shaw et al. | 709/200 |
| 5,813,233 A | * | 9/1998 | Okuda et al. | 62/3.7 |
| 5,854,559 A | * | 12/1998 | Miranda et al. | 324/754 |

OTHER PUBLICATIONS

Hewlett Packard, Product Note 8510–8A, Network analysis, Applying the HP 8510 TRL calibration for non–coaxial measurements.

Hewlett Packard, Hp8510C, Newtwork Analyzer, 45 MHZ to 110 GHz, Unmatched excellence in Microwave Network Analysis.

* cited by examiner

*Primary Examiner*—Ayaz Sheikh
*Assistant Examiner*—Firmin Backer

(57) ABSTRACT

The present invention provides an isothermal port and method for a microwave network analyzer and more particularly an isothermal port and method to control the temperature of microwave standards to 23" 0.050° C. A test port adapter is used to adapt the test port connector to a DUT (device under test, which might be a standard connector). A thermoelectric cooler surrounds the test port adapter in order to precisely control its temperature. By controlling the temperature of the adapter, the temperature of the DUT is controlled since there is good heat conduction between the DUT and the test port adapter. The standards quickly attain the temperature of the test port adapter (less than 2 minutes, 1 minute typical). The system includes a computer, one or more thermoelectric coolers, a heatsink, a split thermal mass that has a through hole for the test port adapter, a power supply, a PRTD (Platinum Resistance Thermal Detector), and an ohmmeter capable of measuring using 4 wire Ohms. The resistance of the PRTD is sensed by the ohmmeter, and a PID (Proportional Integral Derivative) algorithm calculates the correct supply current for the current time interval. The desired power supply current is signaled to the power supply, which sends the current to the thermoelectric coolers. The coolers can remove heat from the test port adapter which tends to lower its temperature. In one embodiment, the control process is repeated every five seconds, and a graph is generated showing the history of the temperature versus time on a computer screen.

8 Claims, 5 Drawing Sheets

ISOTHERMAL PORT FOR MICROWAVE NETWORK ANALYZER AND METHOD

BACKGROUND OF THE INVENTION

The present invention relates to an isothermal port and method for a microwave network analyzer.

In a preferred embodiment, the present invention is intended to be utilized with a microwave network analyzer system such as the Hewlett-Packard Company HP 8510C Microwave Network Analyzer family of products, which provides magnitude, phase and group delay measurements from 45 MHz to 110 GHz.

The HP 8510 network analyzer system has the capability to make real-time error-corrected measurements of components and devices in a variety of transmission media. In general, all that is required is a set of known devices (standards) that can be defined physically or electrically and used to provide a reference for the physical interface of the test devices.

Some of the standards used to calibrate (and verify the performance) of microwave network analyzers are coaxial impedance standards (airlines). Beadless airlines have a center conductor, air dielectric, and an outer conductor. The dimensions of the airline establish the impedance and delay of the airline, and are determined by physical measurements on the airline. The four dimensional features that determine the performance of an airline standard are: 1) length (distance between the mating planes of the outer conductor); 2) the inside diameter of the outer conductor; 3) the outside diameter of the inner conductor; and 4) the difference between the length of the inner and outer conductor (pin depth).

The physical measurements of the airline determine its electrical characteristics and also provide its traceabilty to national standards. Dimensional measurements are made at 20° C., and these dimensions are compensated to 23° C., where the electrical measurements are made. These compensations are done knowing the thermal coefficient of expansion of the base material of the airlines, usually BeCu.

The electrical calibrations and verifications are done on a microwave network analyzer by connecting various standards to its test ports. Although the ambient temperature is 23° C. in the lab during the electrical test, the actual test port temperature is usually higher, due to the heat given off by the internal components in the analyzer which is then conducted through the test ports. Until recently, the microwave network analyzer was only tested for its immunity to ambient temperature fluctuations, and the temperature of the standards themselves was never directly measured.

Recent tests confirmed that the temperature seen by the standards is higher than 23° C., and the type of test set, its mounting conditions (and ventilation) all have an effect on the temperature as seen at the standard when it has been connected to the test port. This elevated temperature causes the airlines to expand, which affects the measurement accuracy and stability, especially at high frequencies. The accuracy is affected because the thermal expansion of the airline changes its electrical properties, some of which are derived from the length of the airlines. The stability is affected because of the additional heating due to handling the parts as the connection is being made. Since the parts may be heating up or cooling down during the measurement sequence, the airlines may not have the same dimensions at the beginning of the measurement as they had at the end.

SUMMARY OF THE INVENTION

It is an object of the present invention to provide an isothermal port and method for a microwave network analyzer.

The present invention provides an isothermal port and method for maintaining a relatively constant temperature at the test port of a network analyzer. The present invention maintains a relatively constant temperature at the standard itself with a feedback control capability.

In one embodiment, the present invention provides an isothermal port for a microwave network analyzer where the analyzer includes a test port. The present invention includes means for sensing the temperature at the test port; processor means for processing the sensed temperature of the test port over time to generate a temperature control signal; and temperature control means responsive to temperature control signal for maintaining a relatively constant temperature at the test port.

Other objects, features and advantages of the present invention will become apparent from the following detailed description when taken in conjunction with the accompanying drawings.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

The present invention provides for thermoelectric cooling of microwave impedance standards, and more particularly, the present invention provides an isothermal port and method for a microwave network analyzer to control the temperature of microwave standards to 23" 0.050° C.

Test port adapters are used to adapt the test port connector to a DUT (device under test, which might be a standard connector). A thermoelectric cooler surrounds the test port adapter in order to precisely control its temperature. By controlling the temperature of the adapter, the temperature of the DUT is controlled since there is good heat conduction between the DUT and the test port adapter. The standards quickly attain the temperature of the test port adapter (less than 2 minutes, 1 minute typical).

Figure 1:
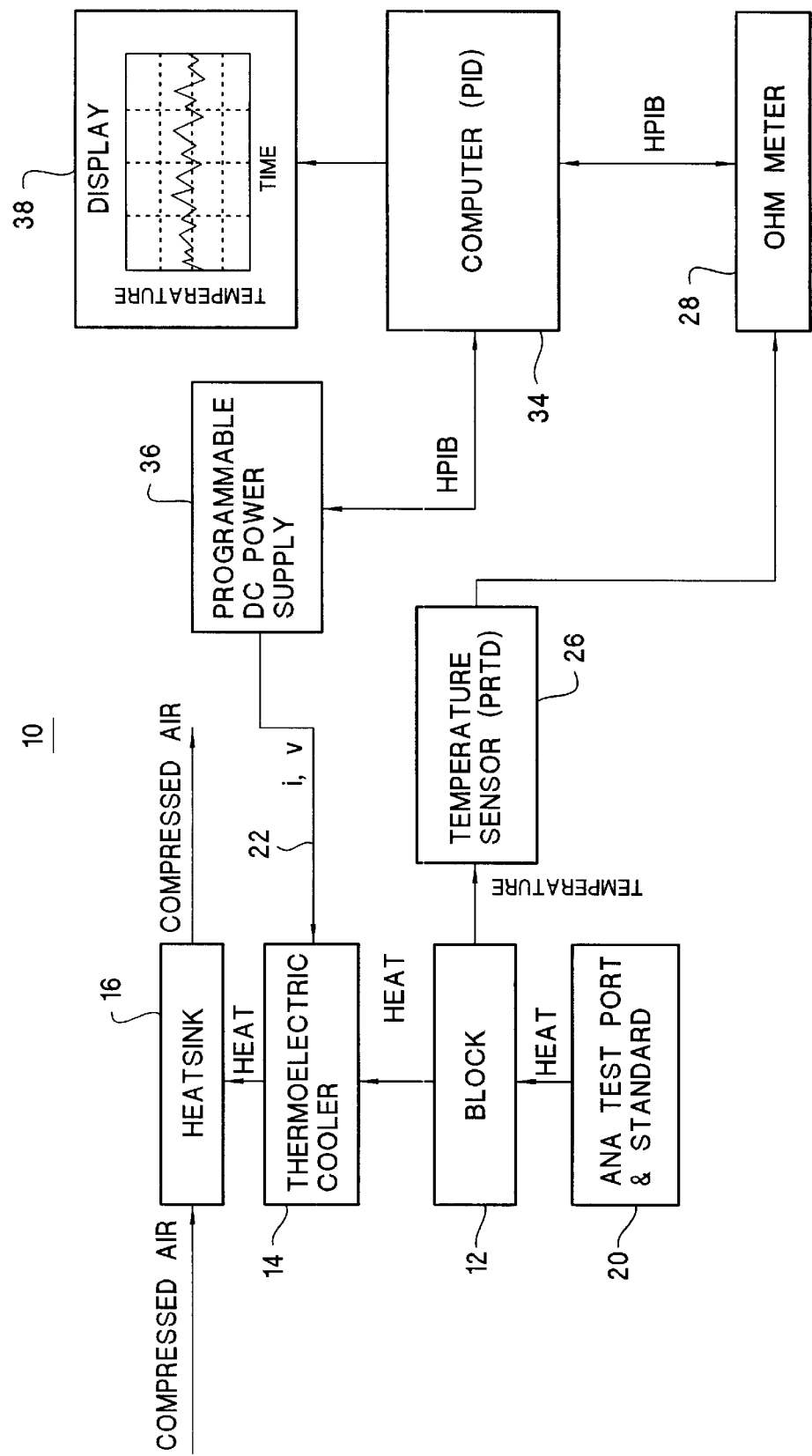
FIG. 1 shows a block diagram of an isothermal port system and method for a microwave network analyzer according to the present invention.

FIG. 1 shows a block diagram of an isothermal port according to the present invention. The isothermal port 10 is designed to maintain a relatively constant temperature at the automatic network analyzer (ANA) test port and standard 20. The isothermal port 10 shown in FIG. 1 includes a block 12 for thermally absorbing heat from test port 20 in a controlled fashion, as will be described.

A thermoelectric cooler 14 thermally absorbs heat from block 12. Thermoelectric cooler 14 in turn provides heat to heat sink 16. Heat sink 16 uses in one preferred embodiment compressed air for absorbing and dissipating heat away from the test port 20. Other types of heat sink functions could be achieved other than with compressed air, such as another type of gas, water, a finned heat sink, or a heat pipe, as examples.

The heat block 12 provides a temperature signal to temperature sensor 26, which preferably is a platinum resistance temperature detector (PRTD). The output of the temperature sensor 26 is sampled by ohm meter 28. Ohm meter 28 is connected to computer 34, which utilizes a proportional integral derivative (PID) algorithm which is used to maintain the relatively constant temperature through a feedback network. The computer 34 provides a control signal to programmable DC power supply 36, which in turn provides suitable voltage and current temperature control signals to thermoelectric cooler 14. Computer 14 determines through the PID algorithm what current to program the power supply 36. Power supply 36 provides current and voltage to thermoelectric cooler 14. More voltage and current presented to thermoelectric cooler means more heat is moved, and less current and voltage means less heat is moved.

In FIG. 1, display 38 provides a visual display of the temperature over time at port 20. The present invention provides a means and corresponding method of maintaining a relatively constant temperature at the test port 20 (the standard itself) in FIG. 1 by a feedback control implementation.

In general, a network analyzer is generating heat when operating, so that there is a steady state. However, there are also disturbances to that steady state, such as when an operator touches a test port, or a new standard is connected to the test port, or the settings inside the network analyzer are changed, and the like. Any such disturbances can change the amount of the heat generated, and the present invention provides a means and corresponding method to compensate for those disturbances or heat changes by maintaining a relatively constant temperature with the isothermal port.

The system in FIG. 1 includes a temperature sensor 26 (a PRTD (Platinum Resistance Thermal Detector))for sensing the temperature at the test port 20 over time and a computer 34 and associated components for processing the sensed temperature of the test port 20 over time to generate a temperature control signal 22. In addition to the computer 34, the computer processing means includes a programmable power supply 36, and an ohmmeter 28 capable of measuring the sensed temperature of the test port 20 using 4 wire Ohms. The resistance of the PRTD 26 is sensed by the ohmmeter 28, and computer 34 uses a PID (Proportional Integral Derivative) algorithm to calculate the correct supply current for the current time interval (a PID algorithm is an algorithm used to regulate a continuous process). The desired power supply current is signaled to the power supply 36, which sends the temperature control current signal 22 to the thermoelectric cooler 14. The cooler 14 removes heat from the test port adapter 20 which tends to lower its temperature. A temperature control means includes one or more thermoelectric coolers 14, a heatsink 16, a heat block 12 including a split thermal mass that has a through hole for the test port 20. In one embodiment, the control process is repeated every five seconds, and a graph is generated showing the history of the temperature versus time on the computer screen 38.

Figure 2A:
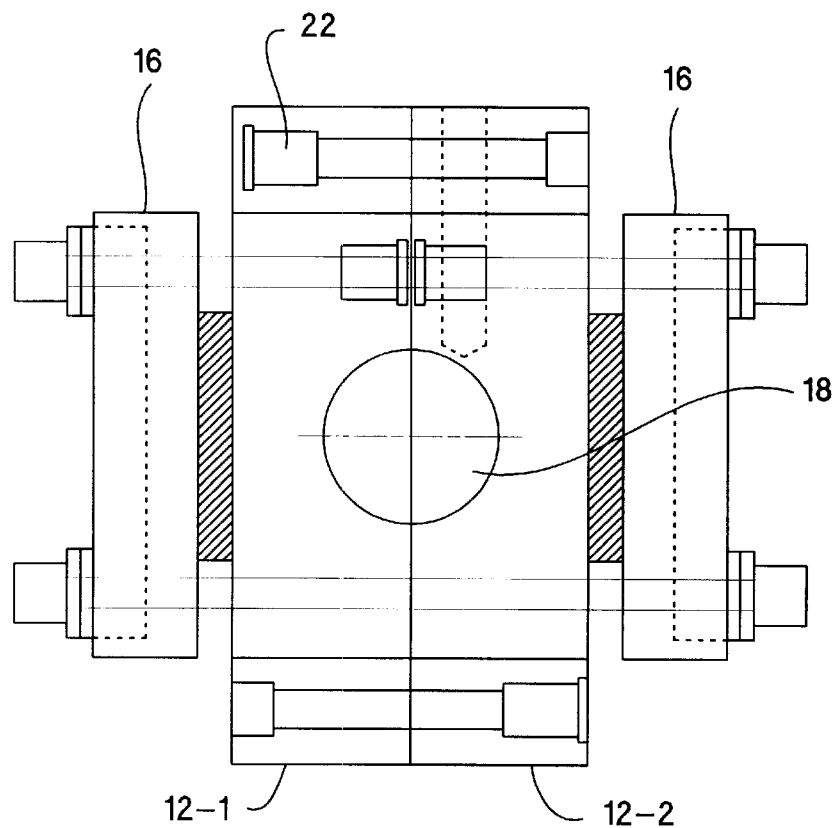
FIGS. 2A and 2B show a front view and a top view, respectively, of a thermoelectric test port of FIG. 1.
Figure 2B:
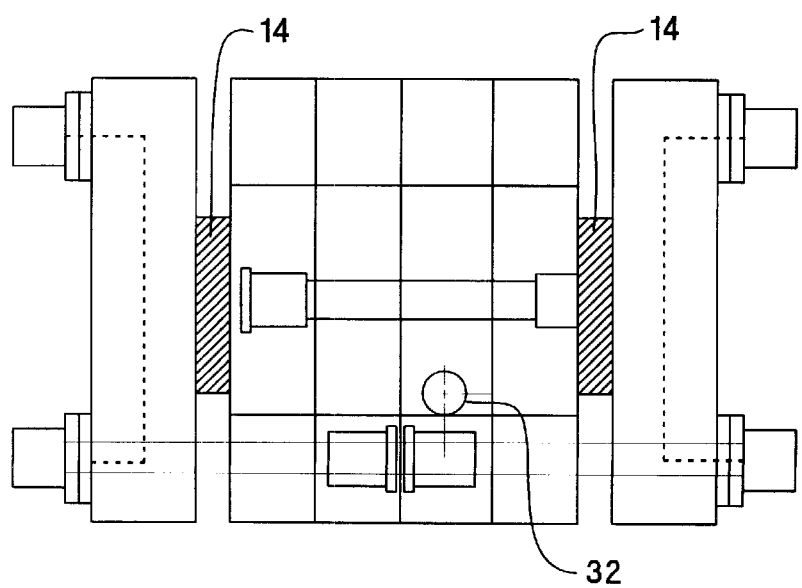

FIGS. 2A and 2B show a front view and a top view, respectively, of a temperature control means or thermoelectric test port of FIG. 1. FIG. 2A shows the front view of the test port in which the round hole 18 is for the test port of a network analyzer such as the test port of the HP 8510 network analyzer. Block 12 of FIG. 1 is comprised of two block halves 12-1, 12-2 shown in FIG. 2A for purposes of attaching to the test port. Screws 22 are for easily securing the temperature control means to the test port. FIG. 2B shows a top view of the temperature control means of FIG. 1 with hole 32 for the thermal sensor 26 of FIG. 1 and thermoelectric cooler 14. Typically, the thermoelectric cooler 14 could be one manufactured by Melcor Corporation.

Figure 3:
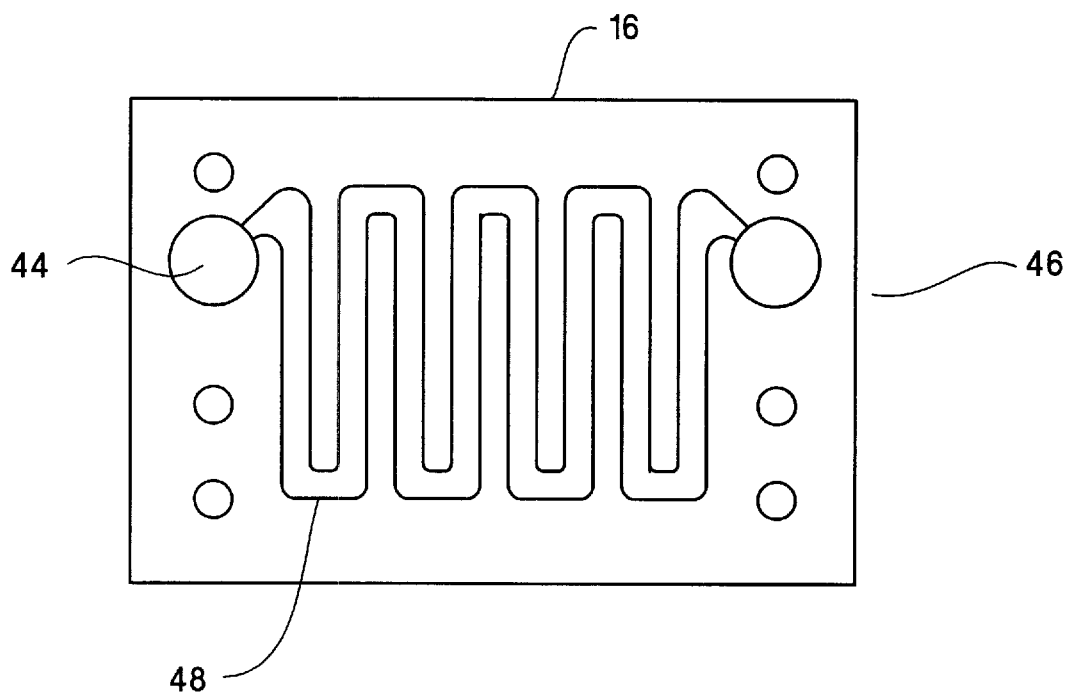
FIG. 3 shows a view of the forced air sealed heat sink, which forms a portion of FIG. 2.

FIG. 3 shows a view of the forced air sealed heat sink 16, which forms a portion of FIG. 1. The forced air heat sink 16 uses in one embodiment compressed air which is input to the input port 44 of the heat sink 16 to the output port 46 via a closed serpentine path 48 which allows for maximum heat transfer away from the test port 20 of FIG. 1.

Figure 4:
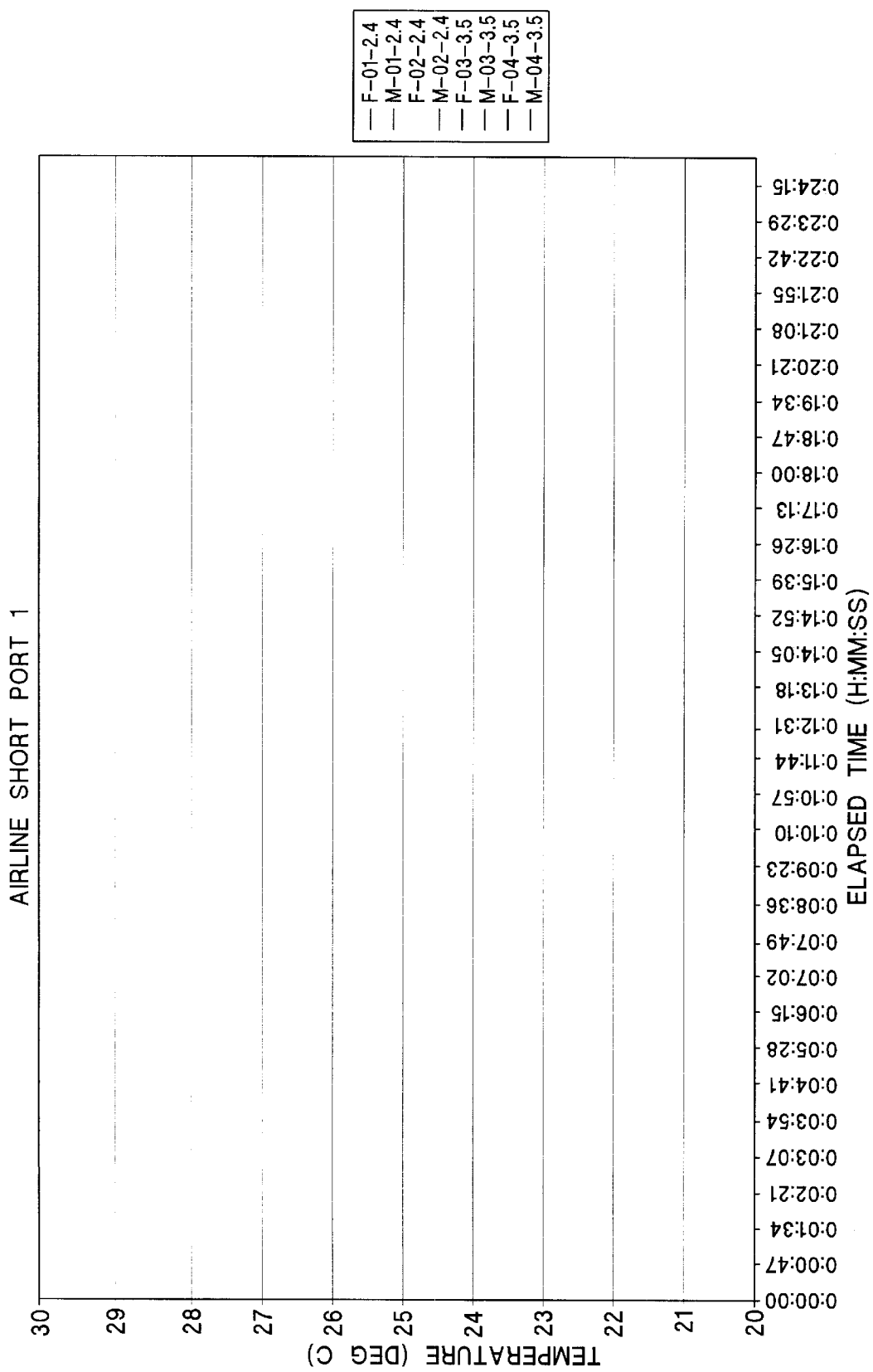
FIG. 4 shows a diagram of temperature comparisons of various analyses of different devices under test (DUT) which are connected to the test port of FIG. 2 without the isothermal port of the present invention.
Figure 5:
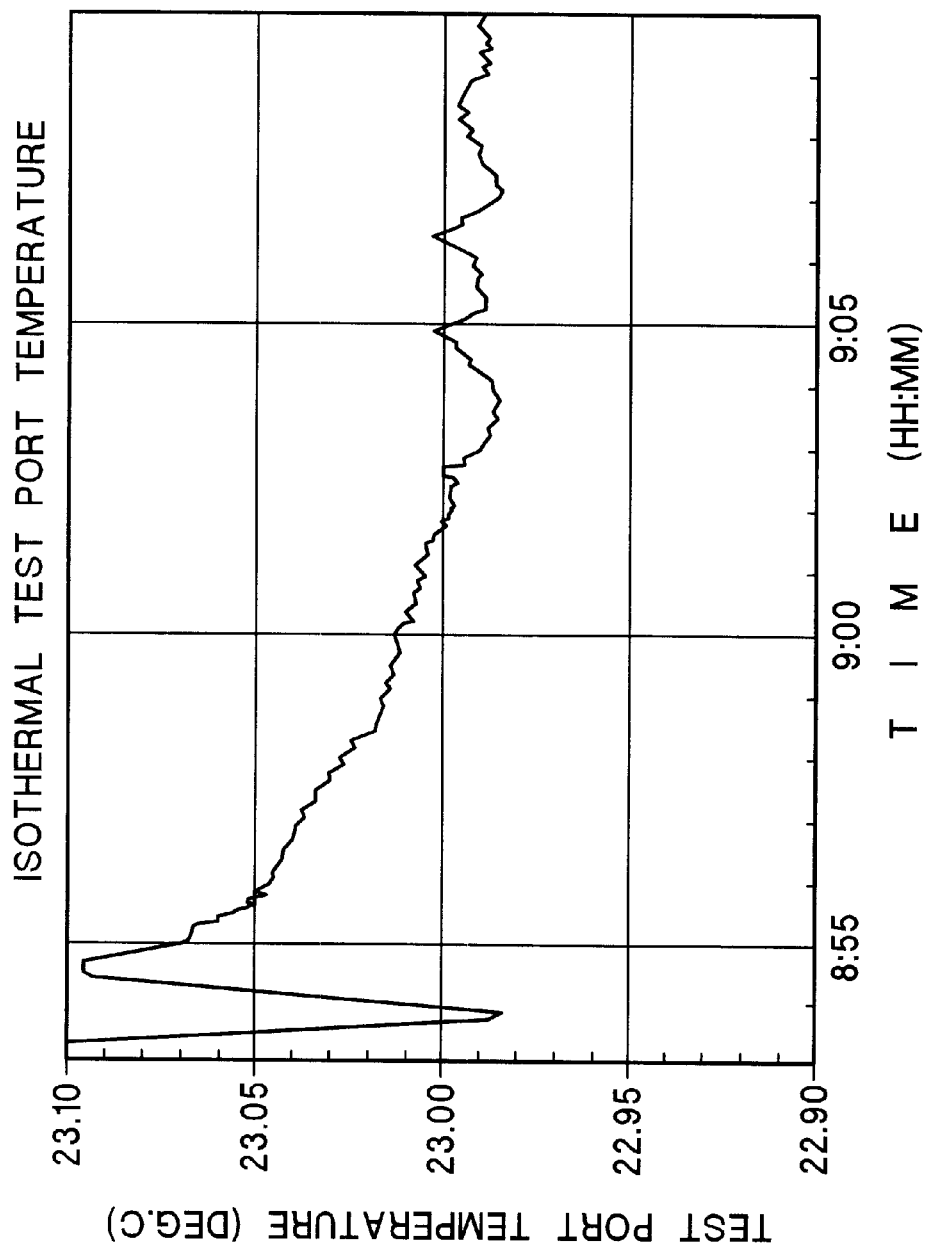
FIG. 5 shows a diagram of a DUT connected to the test port of FIG. 1 with the isothermal port according to the present invention.

FIG. 4 shows a diagram of temperature comparisons of various analyses of different devices under test (DUT) which are connected to the test port of FIG. 1 without the isothermal port of the present invention. In FIG. 4, it can be seen that none of the DUTs have a constant temperature of 23° C. In contrast, FIG. 5 shows a diagram of a DUT (which could be a standard) connected to the test port of FIG. 1 with the isothermal port according to the present invention. FIG. 5 shows a clear improvement of maintaining relatively constant temperature over time at the test port of FIG. 1 (after the initial settling time necessary to reach and maintain the relatively constant temperture).

In accordance with the present invention, consistent, overnight temperature control of the test port has been achieved at a level of 23" 0.050° C. The electrical effects of this system are improved accuracy and repeatability of microwave network analyzer measurements, especially at high frequencies.

In addition to stabilizing the temperature of the standards, the thermoelectric cooler also stabilizes the front end components of the network analyzer. These components are sensitive to temperature changes between the time they are calibrated and the time a measurement is made. By keeping this temperature closer to a single temperature, rather than relying on the ambient temperature (which is more loosely controlled), the electrical performance of the network analyzer also improves, and the calibrations last longer.

The foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching. For example, the present invention could be utilized with other types of test equipment, such as a voltmeter or a spectrum analyzers. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. An isothermal port for a microwave network analyzer where said analyzer includes a test port, the apparatus comprising:

means for sensing temperature at the test port;

processor means for processing the sensed temperature for the test port over time to generate a temperature control signal;

temperature control means responsive to said temperature control signal for maintaining a relatively constant temperature at the test port;

wherein said temperature control means include
a heat block surrounding the test port;
a thermoelectric cooler responsive to said temperature control signal for removing heat from said test port over time; and
a heat sink for dissipating the removed heat away from the test port.

2. The apparatus as in claim 1 wherein said temperature control means includes means for absorbing and dissipating heat from said test port in response to said temperature control signal.

3. The apparatus as in claim 2 including display means for visually displaying the temperature of said test port over time.

4. The apparatus as in claim 1 wherein said heat sink includes an input port, an output port; and a closed serpentine path between said input port and said output port to allow for maximum heat transfer to said heat sink.

5. In a microwave network analyzer where said analyzer includes a test port, the method comprising the steps of:

sensing temperature at the test port;

processing the sensed temperature of the test port over time to generate a temperature control signal;

maintaining a relatively constant temperature at the test port in response to the temperature control signal; and wherein the constant temperature is maintained by removing heat from the test port using a heat block connected to a thermoelectric cooler removing heat responsive to said temperature control signal, and the thermoelectric cooler connected to a heat sink for dissipating the removed heat.

6. An isothermal port for test equipment where said test equipment includes a test port, the apparatus comprising:

means for sensing temperature at the test port;

processor means for processing the sensed temperature for the test port over time to generate a temperature control signal;

temperature control means responsive to said temperature control signal for maintaining a relatively constant temperature at the test port;

wherein said temperature control means include
a heat block surrounding the test port;
a thermoelectric cooler responsive to said temperature control signal for removing heat from said test port over time; and
a heat sink for dissipating the removed heat away from the test port.

7. A network analyzer system comprising:

a network analyzer;

an isothermal port for said microwave network analyzer where said analyzer includes a test port;

means for sensing temperature at the test port;

processor means for processing the sensed temperature for the test port over time to generate a temperature control signal;

temperature control means responsive to said temperature control signal for maintaining a relatively constant temperature at the test port;

wherein said temperature control means include
a heat block surrounding the test port;
a thermoelectric cooler responsive to said temperature control signal for removing heat from said test port over time; and
a heat sink for dissipating the removed heat away from the test port.

8. In test equipment where said test equipment includes a test port, the method comprising the steps of:

sensing temperature at the test port;

processing the sensed temperature of the test port over time to generate a temperature control signal;

maintaining a relatively constant temperature at the test port in response to the temperature control signal; and wherein the constant temperature is maintained by removing heat from the test port using a heat block connected to a thermoelectric cooler removing heat responsive to said temperature control signal, and the thermoelectric cooler connected to a heat sink for dissipating the removed heat.

* * * * *